July 12, 1960 R. W. WESTBERG 2,944,321

METHOD OF FABRICATING SEMICONDUCTOR DEVICES

Filed Dec. 31, 1958

INVENTOR
R. W. WESTBERG
BY [signature]
ATTORNEY

United States Patent Office 2,944,321 Patented July 12, 1960

2,944,321

METHOD OF FABRICATING SEMICONDUCTOR DEVICES

Richard W. Westberg, Bethlehem, Pa., assignor to Bell Telephone Laboratories, Incorporated, New York, N.Y., a corporation of New York Filed Dec. 31, 1958, Ser. No. 784,315

4 Claims. (Cl. 29—25.3)

This invention relates to alloy junction semiconductor devices and, more particularly, to methods of fabricating such devices.

As is well known, alloy junction semiconductor devices generally comprise a wafer of semiconductive material of one conductivity type which has alloyed on at least one surface thereof a small quantity of an appropriate significant impurity element, or an alloy thereof, for forming a region of the opposite conductivity type. Thus, the alloying of a small button of an appropriate impurity containing element produces a PN junction. Typically, an alloy junction transistor includes a wafer of N-type conductivity germanium or silicon with small metallic buttons, for example of indium in the case of germanium and aluminum in the case of silicon, on opposite faces of the wafer. The resulting structure with the attachment of suitable electrode leads to the buttons and to the wafer is a PNP alloy junction transistor.

Alloy junction devices are customarily fabricated as individual elements in elaborate jigs which support the wafer and the alloy buttons in the proper relation during the heating cycle. Current methods involve inherent drawbacks from the standpoint of mass production because of the precise control necessary to achieve a desirable uniformity in the structure of the semiconductor device.

It is one object of this invention to produce improved alloy junction semiconductor devices.

It is also an object to fabricate more uniform alloy junction semiconductor devices.

A further object of this invention is a method of fabricating alloy junction semiconductor devices more rapidly by accomplishing the alloying of batch lots.

In one specific example in accordance with the method of this invention, PNP germanium alloy junction transistors are produced by preparing a large slice of single crystal N-type germanium of suitable thickness and having a large transverse dimension. The crystallographic orientation of the slice faces preferably should be close to the (1.1.1) plane. A coat of masking material, for example, a colloidal suspension of carbon, such as aquadag, is applied to the entire surface of the slice except for small circular areas which are regularly spaced and in alignment on opposite faces of the slice. These small areas are unprotected and thus mark the prospective location of the alloy regions. The partially masked slice is then immersed in a molten bath of indium saturated with germanium. The temperature of the bath then is increased a small amount which unsaturates the solution and enables dissolution of germanium from the unmasked portions of the slice. After a time sufficient to provide the desired base layer thickness through the wafer by such dissolution of germanium, the temperature of the molten bath is reduced to below the value corresponding to saturation which enables material to regrow or solidify from the bath onto the unmasked portions of the slice. This regrowth material will consist of germanium containing a small amount of indium and will have the same crystal orientation as the wafer material but will be of the opposite conductivity type, namely P-type. Thus PN junctions will be produced near the interfaces between the regrown material and the original wafer on both sides of the slice at all of the unmasked locations. The slice then is withdrawn from the bath and is divided into a number of individual alloyed wafer elements by mechanical or chemical methods. Thus, a single slice of germanium semiconductive material may yield as many as one hundred fifty alloyed transistor elements from a single alloying operation in accordance with this invention.

An advantage of this invention, therefore, is the processing and alloying of a single large slice of semiconductive material to produce a large number of individual alloyed elements without the difficulties involved in handling very small semiconductor wafers.

A further advantage of this invention is that essentially constant temperature conditions for regrowing opposite conductivity type material are provided by this molten bath method, thus enabling more uniform, undistorted formation of the regrowth material.

A further advantage of this invention is the facility with which additional regrowth material may be produced so as to enable a more advantageous structure from the standpoint of heat dissipation and for final assembly.

The invention and its other objects and features will be more clearly understood from the following detailed description taken in conjunction with the drawing in which:

Fig. 1 is a perspective view of a slice of semiconductor material masked in accordance with the method of this invention;

Figs. 2, 3, 4, and 5 are cross-section views of the portion of the slice showing in sequence the making of an alloy junction device in accordance with this invention;

Figure 1:
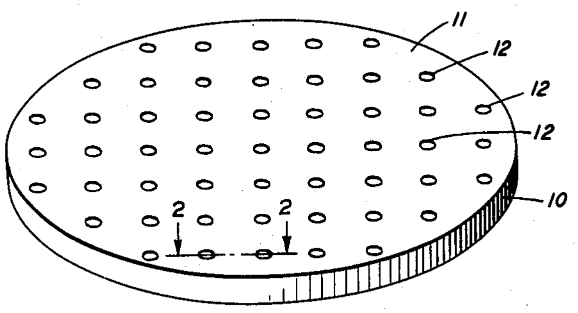

Turning to Fig. 1, there is shown a substantially circular slice 10 of N-type germanium cut from a large single crystal ingot. After further processing, including chemical etching, such a slice typically may have an average diameter of about 0.6 inch and a thickness of about .003 inch. A coating 11 of a masking material is applied to the entire slice except for the small circular exposed areas 12 spaced over the opposed faces of the crystal in an identical pattern so that each exposed area on the upper face seen is in register with an exposed area in the lower face not seen. Typically, the circular exposed areas on one face may be larger than those on the other face in accordance with well-known transistor geometries in which the collector and emitter junctions differ in area. Typically, the smaller circular areas 12 may have a diameter of 0.02 inch and the larger diameter of 0.03 inch, and the center-to-center spacing be about 0.05 inch.

The masking material is one which provides a tough adherent film on the surface of the germanium which will withstand the elevated temperature to be encountered in the molten bath in which the slice is to be immersed. Suitable masking materials include certain colloidal suspensions of graphite, such as aquadag, prodag and oildag. Another suitable masking material is a slurry of magnesium hydroxide. Certain silicone materials also may be satisfactory for this purpose.

Using a coating 11 of aquadag, the particular pattern of the mask on the germanium surface is produced by placing simultaneously against each face of the slice a jig formed by a separate array of properly registered round metal rods which conform to the circular areas 12. While this jig is held against the slice, the aquadag is flowed or sprayed against the germanium slice and allowed to dry and harden. After the masking material has hardened sufficiently, the metal jigs are withdrawn and the slices then are in the condition shown in Fig. 1. An alternative masking technique involves a flexible pattern which is coated with the aquadag and then the desired image is transferred to the slice by "printing."

Figure 2:
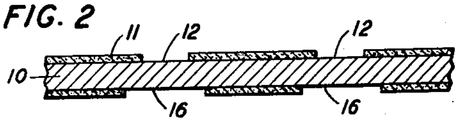
Figure 6:
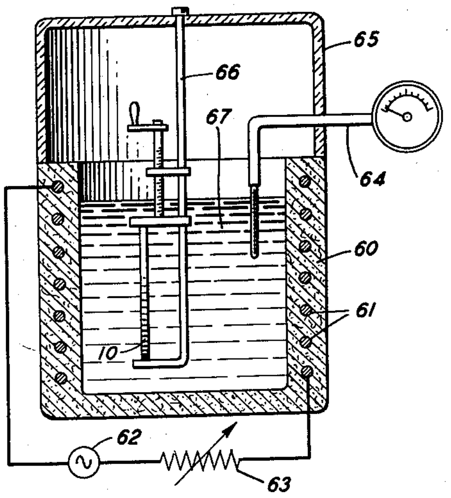
Fig. 6 is a diagram in cross section of the apparatus for maintaining a molten bath for use in the method of this invention.
Figure 7:
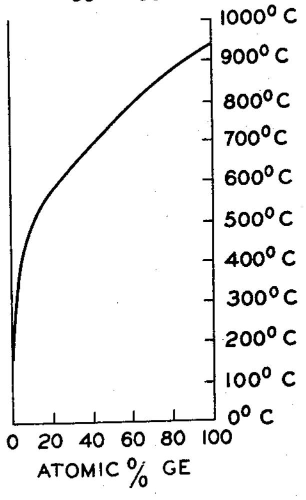
Fig. 7 is a phase diagram of the germanium-indium system.

A portion of the slice is shown in cross section in Fig. 2. It can be seen that the slice 10 has corresponding areas 12 and 16 on opposite sides of the slice which are not covered by the masking material 11. The entire slice 10 is then placed in a suitable holder 66, as shown in Fig. 6, which may simply be a clamp on a suitable support arrangement. The apparatus of Fig. 6 represents, in greatly simplified form, a container 60 having a heating coil 61 installed in the walls of the container and connected to a source of electric power 62. The molten material 67 is maintained at desired temperatures, as measured by the thermometer 64, by adjustment of a variable resistor 63 serially connected with the heating power source 62. Advantageously, the apparatus is fitted with a tight cover 65 in order to assure control of the atmosphere surrounding the bath during the process to minimize contamination. The molten material 67 is a solution of germanium and indium. Other elements also may be included in the bath, for example, additives such as tin may be provided to enhance the wetting ability of the bath. This solution has a very high percentage of indium so as to be saturated with germanium at a convenient temperature, such as 300 degrees centigrade. From the phase diagram of Fig. 7 it can be seen that the percentage of germanium in this solution would be fairly low, about five percent.

Figure 3:
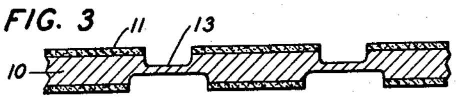

With the molten bath 67 at 300° C., the saturation temperature of the germanium-indium solution, the mounted slice 10 is immersed in the bath and the container is suitably covered and a neutral or reducing atmosphere is provided within the container. The apparatus advantageously is allowed to stabilize at the specified temperature for several minutes. Then the temperature of the molten bath is raised slightly by increasing the power to the heating coil 61. This increase in temperature may be a few degrees centigrade. After thus increasing the temperature, the molten bath is no longer saturated with germanium. Consequently, in order to achieve anew the saturated or equilibrium condition at the new temperature point, the percentage of germanium in the molten bath tends to increase and therefore some dissolution of germanium from the slice 10 occurs. This dissolution, of course, occurs only over the uncoated areas 12 and 16 of the slice and the depth of this dissolution is controlled by controlling the temperature of the molten bath 67, the time allowed for dissolution, and the quantities of alloying material and germanium in the system. Advantageously, the dissolution of germanium continues until the desired thickness of the base lever 13, as best seen in Fig. 3, is attained. It is not necessary to allow saturation equilibrium to be reestablished, and the time of dissolution may be controlled to achieve the desired depth of dissolution. The particular parameters for this step are best determined to provide the desired dissolution in a convenient time by simple empirical observation. Typically, this can be arranged to occur in about ten minutes.

Figure 4:
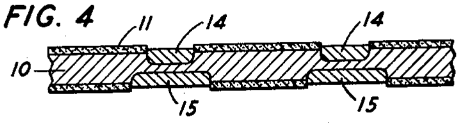
Figure 5:
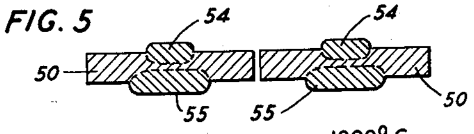

After the dissolution step, the temperature is lowered to a temperature such that the bath is then in a supersaturated condition with respect to germanium. For example, when the temperature is lowered again to 300° C., material from the solution will tend to regrow on the uncoated germanium areas and will be deposited in the regions 14 and 15, as shown in Fig. 4. This material, which is largely germanium with a small percentage of indium in its regrown form, will be of P-type conductivity because of the indium, so that PN junctions are formed near the interfaces of the regrown regions 14 and 15 and the original N-type material of the slice 10. Advantageously, the regrowing step may be continued for a time sufficient to enable a pile-up of material well above the surfaces of the slice 10. Typically, such time will be several times that used for the dissolution step. The regions of regrown P-type material 14 and 15 will be of single crystal material having the same orientation as the slice material from which it is grown. Finally, in accordance with the method of this invention, as shown in Fig. 5, the portions of the slice 10 are divided into a number of individual alloyed wafers 50, each of which comprises the basic element of a PNP alloy junction transistor. This final operation includes removing the masking material for example by immersing in an ultrasonically agitated washing solution. The slice may then be divided into either square or circular wafers by ultrasonic cutting as is now well known in the art. Alternatively, the slice may be divided into individual wafers by scribing lines through the masking material between the individual wafers and using an etchant to attack the scribed portions. For this technique it may be necessary to apply a suitable mask over the alloyed portions of the slice.

A further advantage of the alloying method of this invention is realized in the facility with which wire leads may be molded into the alloyed regions. For example a grid composed of wire for such connections may be positioned alongside the surfaces of the slice so that the final portion of the regrowth process effectively molds portions of the wire into the electrodes. After removal from the bath the wires may be cut between the individual transistor elements.

In connection with the control of the temperature of the molten bath for accomplishing the dissolution and regrowing steps of this invention, an alternative technique which provides advantageous control involves the use of a bath containing zones at different temperatures. In such a system the slice would undergo dissolution in the higher temperature upper part of the bath and then be lowered to a lower temperature saturated portion of the bath where the temperature is lowered still further to cause regrowth of opposite conductivity type germanium.

Also, in connection with the final processing of the alloyed elements, the etching operation required to delineate the junctions surrounding the alloyed regions may simultaneously accomplish the division of the slice into individual wafers. It will be understood that many variations in connection with these particular process steps may be used by those skilled in the art without departing from the spirit and scope of this invention.

For example, in addition to producing alloy regions of opposite conductivity type the method of this invention may provide alloy regions of the same conductivity type as the original slice material. Thus, an array of base electrodes may be produced on the base region 10 of the foregoing-described specific embodiment by remasking all of the slice except the areas upon which the base electrodes are to be formed and immersing the slice in a second bath containing an N-type impurity such as bismuth or antimony and repeating the above-described alloying process.

Further, the controlled dissolution process of this invention may be used to etch semiconductor material to desired sizes and at the same time determine the suitability of the material for alloy junction processing by observing the uniformity of the rate of etching over a given surface.

Figure 8:
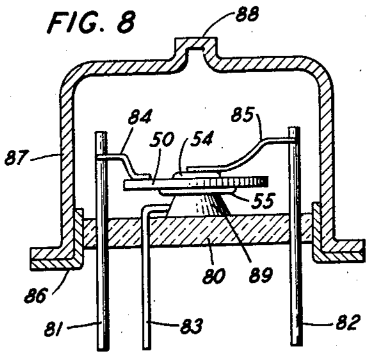
Fig. 8 is a diagram in cross section of one form of a semiconductor device produced in accordance with this invention.

As shown in Fig. 8, the PNP alloy junction transistor element may be suitably mounted on a pedestal or platform 89 affixed to an insulating header 80 which, in turn, is surrounded by a metal eleyet 86. Taking the upper alloy region as the emitter, an emitter lead 85, a base lead 84 and a collector lead 83 are attached to the semiconductor element and brought to the outside of the housing by suitable leads 81, 82 and 83. Finally, the device is enclosed in a metal can 87 which is attached to the metal eyelet 86 by welding. In certain instances, a short tubulation 88 is provided to enable exhausting or backfilling of the transistor housing to provide a suitable atmosphere for stability.

The method of this invention has an important advantage over prior art methods in that the proper geometric relation between the alloy junction regions on the opposite side of the semiconductor device is assured facilely by accurate application of the masking material. Furthermore, the amount of regrowth material which may be piled up on each alloy region is not limited to a particular quantity. This enables more facile attachment of electrode leads as a consequence of the greater amount of material for soldering as well as enhancing the heat dissipating characteristics of the collector junction region. This enhancement will occur because of the better heat conductivity properties of germanium as compared with indium, the latter element being a minor constituent of the alloyed region in contrast to prior art structures in which germanium is the minor constituent. Another advantage of this method is the facility with which alloyed areas of shapes other than circular may be easily obtained. For example, emitter regions of rectangular shape, or series of rectangles, or annular ring shape may be produced readily by selecting the proper mask pattern.

Although the invention has been described in several specific embodiments, it will be understood that they are but illustrative and that other arrangements may be devised by those skilled in the art without departing from the spirit and scope of the invention. Similarly, the principles may be extended to the fabrication of alloy devices in which the semiconductive material comprises silicon, silicon-germanium alloys, the group III—group V intermetallic compounds and other known semiconductive compounds. Typically the process of this invention may be accomplished using silicon and a molten bath comprising aluminum and silicon.

What is claimed is:

1. A method of fabricating a semiconductor signal translating device comprising applying a mask to portions of the surfaces of a body of semiconductive material of one conductivity type, immersing said body in a molten bath comprising a mixture of said semiconductive material and a significant impurity of the conductivity type opposite to said one conductivity type, said molten bath having a temperature corresponding to the condition of saturation of said semiconductive material in said mixture, raising the temperature of said bath proximate to said body thereby to dissolve material from the unmasked portions of said body, lowering the temperature of said bath proximate to said body thereby to regrow semiconductive material of the opposite conductivity type on said unmasked portions, removing said body from said bath, removing said mask, and applying electrodes to the different conductivity type regions of said body.

2. A method of fabricating a semiconductor signal translating device comprising applying a heat resistant mask selectively to the surface of a body of semiconductive material of one conductivity type, immersing said body in a molten bath comprising a mixture of said semiconductive material and an impurity of the opposite conductivity type to said one conductivity type at a temperature corresponding to the saturation condition of said semi-conductive material in said mixture, raising the temperature of said bath proximate to said body thereby to dissolve material from the unmasked areas of said body, lowering the temperature of said bath proximate to said body thereby to regrow single crystal semiconductive material having substantially the same crystalline orientation and the opposite conductivity type as said body on said portions from which dissolution has occurred, removing said body from said bath, and applying electrodes to the separate conductivity-type regions of said body.

3. The method of fabricating semiconductor signal translating devices comprising providing a slice of single crystal germanium of one conductivity type, coating said slice with a heat resistant material except for selected areas which are left uncoated, immersing said slice in a molten bath at a temperature of about 300° C., said bath comprising a mixture of germanium and an opposite conductivity type inducing impurity, said bath being saturated with germanium, raising the temperature of said bath proximate to said slice thereby to dissolve germanium from said selected areas of said slice, lowering the temperature of said bath proximate to said slice thereby to regrow germanium of the opposite conductivity type on said selected areas, removing said slice from said bath, dividing said slice into a plurality of semiconductor bodies and removing said heat resistant material, and applying electrodes to the different conductivity type regions of each of said bodies.

4. The method in accordance with claim 3 in which said heat-resistant coating is formed from a colloidal suspension of graphite.

No references cited.